United States Patent [19]
Ali

[11] Patent Number: 5,016,216
[45] Date of Patent: May 14, 1991

[54] DECODER FOR A FLOATING GATE MEMORY

[75] Inventor: Syed Ali, Cupertino, Calif.

[73] Assignee: WaferScale Integration, Inc., Fremont, Calif.

[21] Appl. No.: 258,926

[22] Filed: Oct. 17, 1988

[51] Int. Cl.$^5$ .................. G11C 7/00; G11C 16/04; G11C 8/00

[52] U.S. Cl. .................. 365/185; 365/230.06; 365/230.04; 365/51; 365/230.02

[58] Field of Search .................. 365/230.02, 230.03, 365/230.04, 230.06, 189.02, 214, 210, 185, 51, 63, 207, 208, 210, 189.01; 357/23.4

[56] References Cited

U.S. PATENT DOCUMENTS

| | | | |
|---|---|---|---|
| 4,393,472 | 7/1983 | Shimada et al. | 365/203.04 |
| 4,409,723 | 10/1983 | Harari | 29/571 |
| 4,418,399 | 11/1983 | Sakurai | 365/63 X |
| 4,596,001 | 6/1986 | Baba | 365/207 X |
| 4,601,019 | 7/1986 | Shah et al. | 365/230.02 X |
| 4,608,672 | 8/1986 | Roberts et al. | 365/230.04 |
| 4,639,893 | 1/1987 | Eitan | 365/185 |
| 4,680,738 | 7/1987 | Tam | 365/830.04 X |
| 4,700,328 | 10/1987 | Burghard | 365/207 X |
| 4,758,988 | 7/1988 | Kuo | 365/185 X |
| 4,849,937 | 7/1989 | Yoshimoto | 365/203.04 X |

OTHER PUBLICATIONS

Ali, "A 50-ns 256K CMOS Split-Gate EPROM," IEEE Journal of Solid-State Circuits, vol. 23, No. 1, Feb. 1988, pp. 79-85.

*Primary Examiner*—Alyssa H. Bowler
*Attorney, Agent, or Firm*—Skjerven, Morrill, MacPherson, Franklin & Friel

[57] ABSTRACT

An array of floating gate transistors is arranged so that in the transistors within the even numbered rows, the bit line on the left side of the transistor serves as the drain, and the bit line on the right side of the transistor serves as the source, and the floating gate extends over the left side of the transistor channel. Conversely, in the odd numbered rows, the bit line on the right side of each transistor serves as the drain, the bit line on the left side of each transistor serves as the source, and the floating gate extends over the left side of the transistor channel. Thus, in order for the bit line decoder to determine which bit line is to be grounded and which bit line is to be connected to a sense amplifier, the bit line decoder also receives signals indicative of the row which has been addressed. In one embodiment, the array comprises redundant rows. The decoder is constructed so that any redundant rows can be used to replace either an odd or even-numbered row in the array. The array also includes a dummy transistor column. Means are provided for coupling a transistor from the dummy transistor column to the sense amplifier which has a floating gate on the same side of the channel as a transistor being read. Decode means are provided for coupling each dummy bit line to either ground or the sense amplifier.

20 Claims, 9 Drawing Sheets

DECODER FOR A FLOATING GATE MEMORY

BACKGROUND OF THE INVENTION

This invention relates to integrated circuits including an array of asymmetric cells, e.g. split gate floating gate memory devices such as EPROMs or EEPROMs, and more specifically to address decoder circuits for floating gate memory devices.

FIG. 1 illustrates an array 10 of split gate floating gate transistors including a group of control gates or word lines WL0 to WL3, a group of source/drain regions or bit lines BL0 to BL9, and a group of floating gates FG1 to FG36. Although FIG. 1 only illustrates four word lines, ten bit lines and 36 floating gates, typical floating gate memory arrays comprise a much larger number of word lines, bit lines and floating gates. The transistors of array 10 are asymmetric, i.e. the floating gates cover a portion of the channel adjacent to the transistor drain but not adjacent to the transistor source.

Array 10 employs a "virtual ground" architecture. This means that bit line BL1 is used as a drain when it is desired to read or program the state of floating gates FG1, FG10, FG19 and FG28, but is used as a source when it is desired to read or program the state of floating gates FG2, FG11, FG20 and FG29. Similarly, the other bit lines in array 10 are used as either source regions or drain regions, depending upon whether it is desired to read or program the state of a transistor immediately to the right or immediately to the left of the bit line. Virtual ground memory devices are discussed, for example, in U.S. Pat. No. 4,409,723 issued to Eliyahou Harari on Oct. 18, 1983 and incorporated herein by reference.

FIG. 2 schematically illustrates a portion of array 10 and bit line decode circuit 11 for coupling a first one of the bit lines to ground and a second one of the bit lines to a sense amplifier SA. The bit lines are organized into groups of eight, each group being coupled to an associated predecode multiplexer 12, each predecode multiplexer being coupled to a second decode multiplexer 13. As can be seen, bit lines BL0 to BL7 can each be coupled to a lead L1-1 via transistors Q-1-0 to Q-1-7, respectively, and lead L1-1 can be coupled to ground via a transistor QA. Similarly, bit lines BL1 to BL8 can be coupled to a line L2-1 via transistors Q-2-1 to Q-2-8 respectively, which in turn can be coupled to sense amplifier SA via a transistor QB. Transistors Q-1-0 to Q-1-7 and Q-2-1 to Q-2-8 are part of a first one of predecoder multiplexers 12.

Bit lines BL8 to BL15 are coupled to a line L1-2 via transistors Q-1-8 to Q-1-15, respectively (within a second one of multiplexers 12), which in turn is coupled to ground via a transistor QC (within multiplexer 13). Similarly, bit lines BL9 to BL16 are coupleted to a line L2-2 via transistors Q-2-9 to Q-2-16 (part of the second one of multiplexers 12) which in turn is coupled to sense amplifier SA via a transistor QD. Thus, it is seen that every eighth bit line, starting with bit line BL8, is coupled to ground via a first one of predecode multiplexers 12 and to sense amplifier SA via a second one of predecode multiplexers 12. Multiplexers 12 are controlled by signals Y0 to Y7 decoded from EPROM column address lines A0 to A2 (not shown). Multiplexer 13 is controlled by the other EPROM column address lines.

It would be desirable to reduce the size of array 10. One method of doing this would be to move the word lines closer to each other, e.g. moving word line WL0 closer to word line WL1 (see FIG. 1). This would entail either moving floating gates FG1 to FG9 closer to floating gates FG10 to FG18, or making the floating gates narrower. Unfortunately, design considerations dictate that a certain amount of space be left between the floating gates and that the floating gates be a certain width. These design considerations are described in U.S. Pat. application Ser. No. 07/258,952, filed 10/17/88, entitled "Split Gate Memory Array Having Staggered Floating Gate Rows and Method For Making Same", filed by Boaz Eitan and Reza Kazerounian on the same day as the present Application, and incorporated herein by reference.

Briefly, the major factors governing the width of the transistor cell are as follows:

1. Each transistor must have a channel sufficiently wide to conduct an appropriately large read current.
2. Each floating gate must overlap the "bird's beak" formed at the periphery of field oxide FOX. (Field oxide FOX is placed between the various floating gates to prevent parasitic channels from forming between adjacent transistors.) The bird's beak is describe in the above-incorporated Eitan et al. application.
3. A certain amount of space must be left between adjacent floating gates so that the floating gates may be defined properly without contacting one another.

One method of reducing the transistor cell widths is to stagger the floating gates, e.g., as in array 20 illustrated in FIG. 3. Thus, instead of being placed directly adjacent bit line BL2, floating gate FG5 is placed directly adjacent bit line BL1 while floating gate FG2, formed in the same column of transistor as floating gate FG5, is directly adjacent bit line BL2.

For reasons described in detail in the above-incorporated Eitan et al. application, staggering the floating gates eliminates the need for providing field oxide FOX, and thus, the floating gates do not have to overlap a "bird's beak" region of field oxide.

A staggered floating gate arrangement also permits a reduction in the length of each cell by permitting a reduction in the width of each bit line. In array 10, if the bit lines are self-aligned with the floating gates (see U.S. Pat. No. 4,639,893, issued to Eitan and incorporated herein by reference), and the floating gates are misaligned in direction A (see FIG. 1), the effective width of each bit line will be reduced and the bit line resistance will be increased. In order to ensure that the bit line resistance is below a certain maximum value, the width of the bit line mask is enhanced in the prior art. However, in array 20, if the floating gates are misaligned and placed too far to the right, an increase in the resistance along a first portion of the bit lines (such as portion P1) will be partially offset by a decrease in the resistance along a second portion of the bit lines (such as portion P2). Therefore, the bit line resistance in array 20 is less sensitive to floating gate misalignment than the bit line resistance of array 10, and thus array 20 can be formed with narrower bit lines and a smaller cell pitch.

Lastly, during the polysilicon etching step which defines the individual floating gates, the corners of the floating gates are rounded, thereby effectively increasing the distance between the resulting floating gates. This permits the floating gate mask window regions to be closer to one another when manufacturing array 20 than when manufacturing array 10.

In array 20, when it is desired to read (or program) the state of a first group of floating gates within a first column of transistors (e.g., floating gates FG2 and FG10 in column C1), bit line BL2 serves as a drain and bit line BL1 serves as a source, whereas when it is desired to read (or program) the state of a second group of floating gates (such as floating gates FG5 and FG13 in column C1), bit line BL1 serves as a drain and bit line BL2 serves as the source. Thus, unlike the decoder used in conjunction with array 10, a decoder used in conjunction with array 20 must be capable of causing the bit lines to function as either sources or drains depending on the word line being addressed.

During read operations, a dummy transistor from a column of dummy transistors is coupled to a sense amplifier so that the drain voltage of the transistor being read can be compared with the drain voltage of the dummy transistor. It would be desirable to ensure that the transistor selected from the dummy column has its floating gate on the same side of the channel as the transistor being read, so that the selected dummy transistor and the transistor being read have comparable electrical characteristics. Also, since some dummy transistors have their floating gates on one side of the transistor cell, while other dummy transistors have their floating gates on the other side of the transistor cell, the bit line decoder should be capable of coupling each dummy bit line to the ground and to the sense amplifier.

It is desirable to provide redundant rows for replacing defective rows within the EPROM array. It would be desirable to construct the decoder so that each redundant row can replace any row in the array, regardless of whether the replaced row has its floating gates on the left side or right side of the cell.

SUMMARY OF THE INVENTION

A floating gate memory address decoder includes an input lead for receiving a signal indicative of whether an even numbered or odd numbered word line is being held active. During read operations, this signal determines which bit line within a pair of bit lines is to be connected to ground and which is to be connected to a sense amplifier.

In one embodiment, the bit lines are organized into groups of eight, each group of bit lines being connected to an associated predecode multiplexer, each of the predecode multiplexers being connected to a second decode multiplexer. Of importance, every eighth bit line can be connected to either ground or a sense amplifier through two different predecode multiplexers. This permits every eighth bit line to serve as a source or a drain for each adjacent column of floating gate transistors. (In contrast, in the decoder of FIG. 2, every eighth bit line can be coupled to ground through one predecode multiplexer or to sense amplifier SA through another predecode multiplexer. Thus, every eighth bit line could only serve as a drain for one adjacent column of transistors and a source for another adjacent column of transistors.)

In accordance with one embodiment of my invention, the array of floating gate transistors comprises a plurality of redundant rows. If a row within the array contains one or more defective transistors, that row is decoupled from the array and replaced with a redundant row. The bit line decoder receives a signal indicating whether an even-numbered or odd-numbered redundant row is being read. This signal controls which of a pair of bit lines is coupled to a sense amplifier, and which of the bit lines is coupled to ground. The bit line decoder is also used during programming to determine which bit line is to be raised to a programming voltage and which bit line is grounded.

The array contains one or more columns of dummy cells, each dummy cell within a column receiving an associated one of the array word lines. In one embodiment, even-numbered dummy cell transistors have their floating gates on one side of the dummy cell, while odd-numbered dummy cell transistors have floating gates on the other side of the cell. When a transistor within the array is being read, the word line controlling that transistor also turns on one of the dummy cell transistors which is oriented in the same manner as the transistor being read. This ensures that the dummy transistor and the transistor being read have comparable electrical characteristics. In this embodiment, a dummy cell decoder is provided which selectively couples each of the dummy bit lines to the sense amplifier and ground, depending on the orientation of the selected dummy cell transistor.

Listed below are some of the major distinctions between a bit line decoder used in conjunction with prior art array 10 and a bit line decoder in accordance with the present invention.

| Decoder for Standard Split Gate Array | Floating Gate Transistor Decoder for Staggered Floating Gate Transistor Array |
|---|---|
| 1. Since all floating gates are oriented in the same manner, bit line decoding is independent of the row being accessed. | Since the transistors in different rows are oriented differently, bit line decoding is dependent on the row being accessed. |
| 2. Since all floating gates (including the floating gates of dummy cells) are oriented in the same manner, special steps need not be taken to ensure that the dummy cell coupled to the sense amplifier is oriented in the same manner as a cell being read. | Special steps are taken to ensure that a dummy transistor coupled to a sense amplifier is oriented in the same manner as the transistor being read. |
| 3. One of the dummy bit lines is always grounded while the other dummy bit line is always coupled to a sense amplifier. Thus, it is not necessary to decode the dummy bit lines. | The decoder is capable of selectively coupling each dummy bit line to either ground or the sense amplifier. |
| 4. Since all floating gates are oriented in the same manner, any redundant row can replace any row of floating gate transistors, and the bit line decoder need not take into account whether an even or odd-numbered redundant row is being accessed. | An accessed redundant row may be oriented differently from the row being replaced, and this fact is taken into account by the bit line decoder. |
| 5. A given bit line can only serve as a source for a first column of transistors or a drain for a second column of transistors. | A given bit line can serve as a source or a drain for a first column of transistors or a source or a drain for a second column of transistors. |
| 6. Every eighth bit line can be coupled to ground through a first predecoder multiplexer or to a sense amplifier through a second predecoder multiplexer. | Every eighth bit line can be coupled to ground or a sense amplifier through a first predecoder multiplexer, and to ground or a sense amplifier through a second |

|  | -continued |
| --- | --- |
| Decoder for Standard Split Gate Array | Floating Gate Transistor Decoder for Staggered Floating Gate Transistor Array |
|  | predecoder multiplexer. |

DETAILED DESCRIPTION

Figure 3:
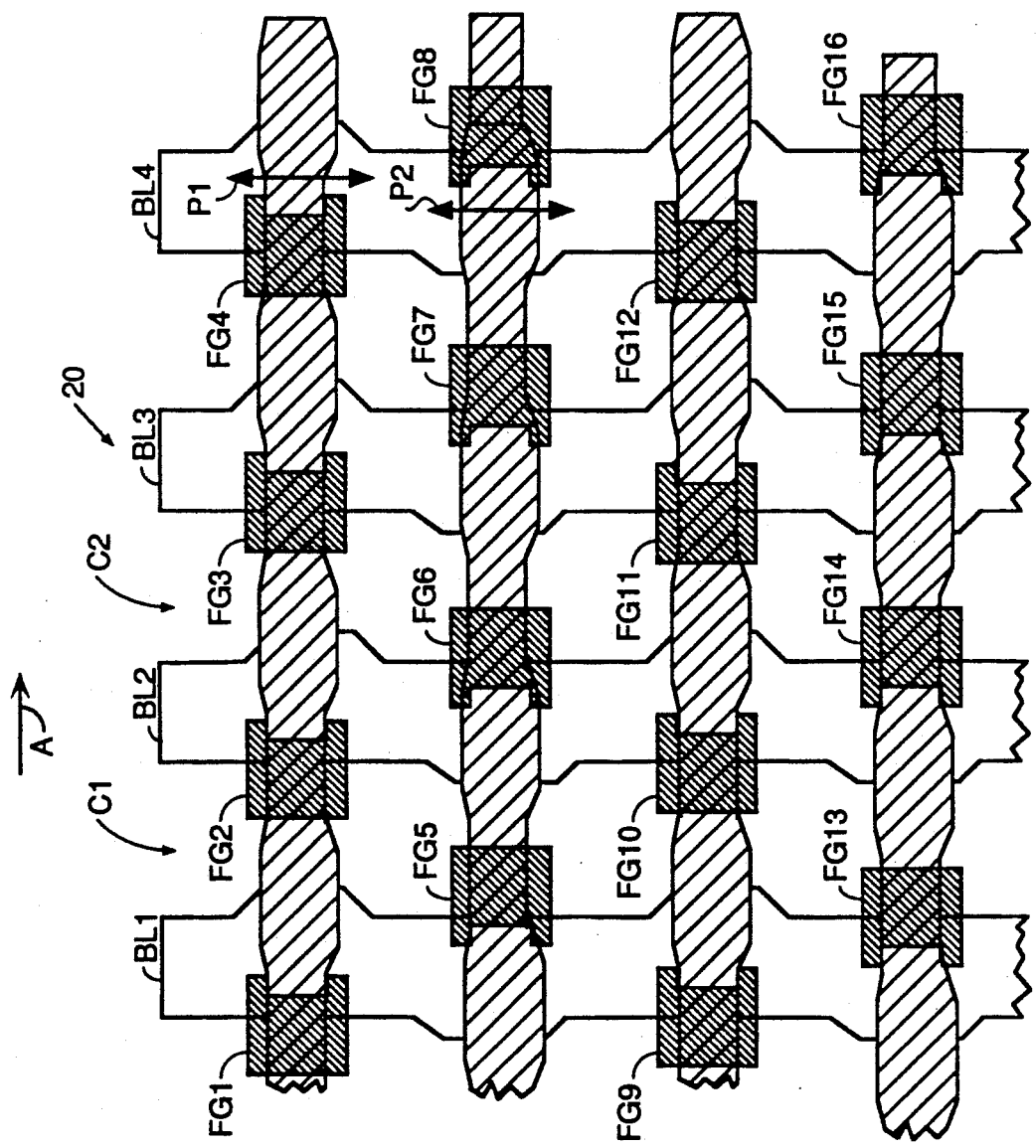
FIG. 3 illustrates an array of floating gate transistors using a staggered floating gate arrangement.

A decoder constructed in accordance with one embodiment my invention is adapted for use in conjunction with an EPROM array of cells having a layout as illustrated in FIG. 3. In one embodiment of my invention, the EPROM array is organized into an array of 2,048 columns by 2,052 rows. Of importance, four of the rows are redundant rows which are used to replace those rows within the array which contain one or more defective cells. Thus, only 2,048 of the rows are actually used. (Although the embodiment described herein is organized into a 2,048 by 2,052 array, the present invention can be used in conjunction with arrays of different dimensions, and arrays excluding redundant rows.)

In one embodiment, the array is organized to store 512K words of data, each word being eight bits wide. The 2,048 columns are divided into blocks of 256 columns, e.g., blocks B1 to B8 (FIG. 4), each block corresponding to an output bit of the 8 bit word. The 256 columns in each block are organized into 32 groups of eight bit lines (such as groups G1 to G32). Each of the eight bit lines in group G1 is coupled to a multiplexer M1 which selectively couples one of the bit lines within group G1 to a first line L1-1 and a second one of the bit lines within group G1 to a second line L2-1. Multiplexers M2 to M32 similarly couple one of the bit lines within associated groups G2 to G32 to a first one of associated lines L1-2 to L1-32, and a second bit line to a second one of associated lines L2-2 to L2-32. A multiplexer M33 receives lines L1-1 to L1-32 driven by multiplexers M1 to M32 and couples one of those lines to an input lead 57 of a sense amplifier SA. Multiplexer M33 also couples one of lines L2-1 to L2-32 to ground. In this way, multiplexers M1 to M33 couple one of the bit lines within block B1 to sense amplifier SA and another one of the bit lines to ground.

Figure 1:
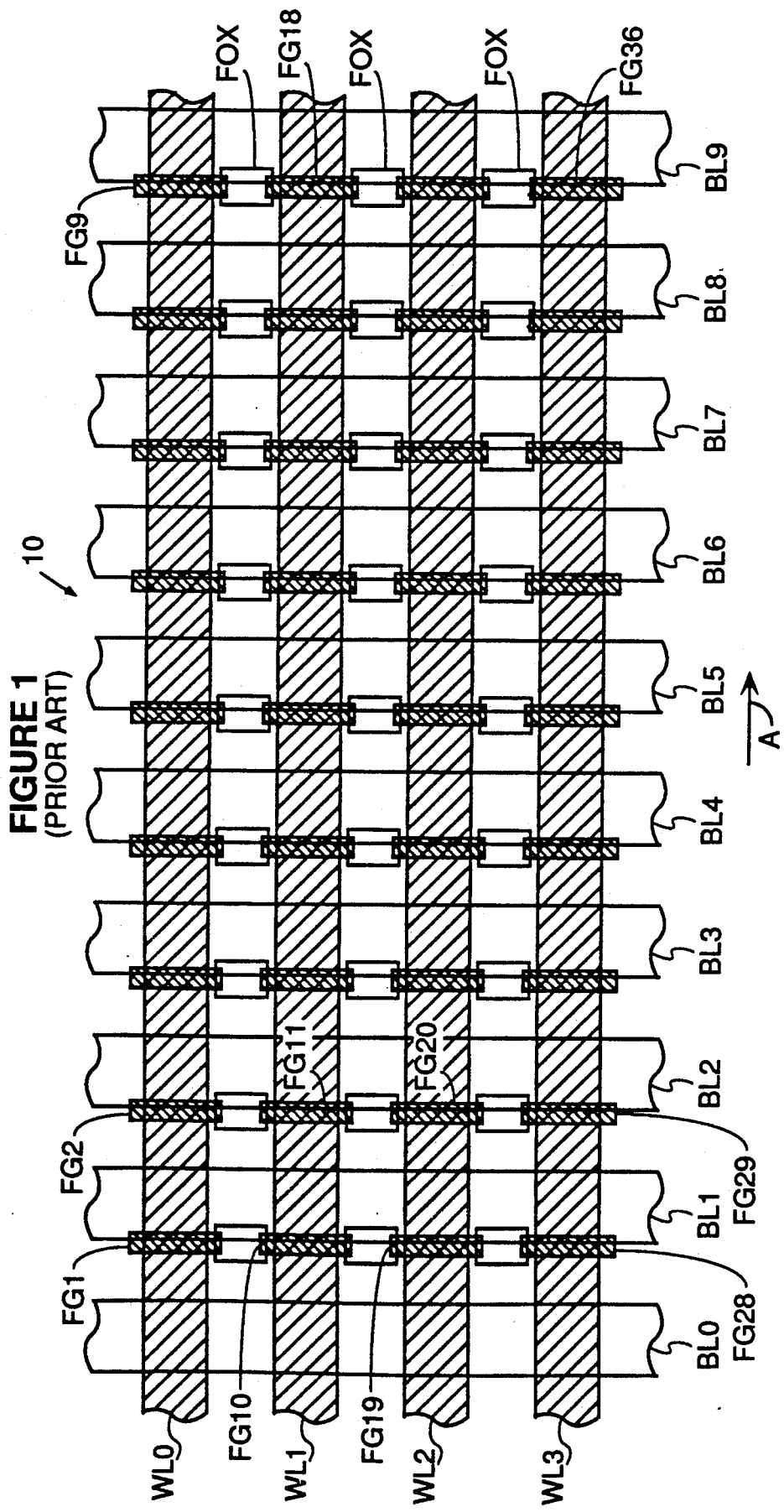
FIG. 1 illustrates in plan view a virtual ground array of floating gate transistors constructed in accordance with the prior art.
Figure 2:
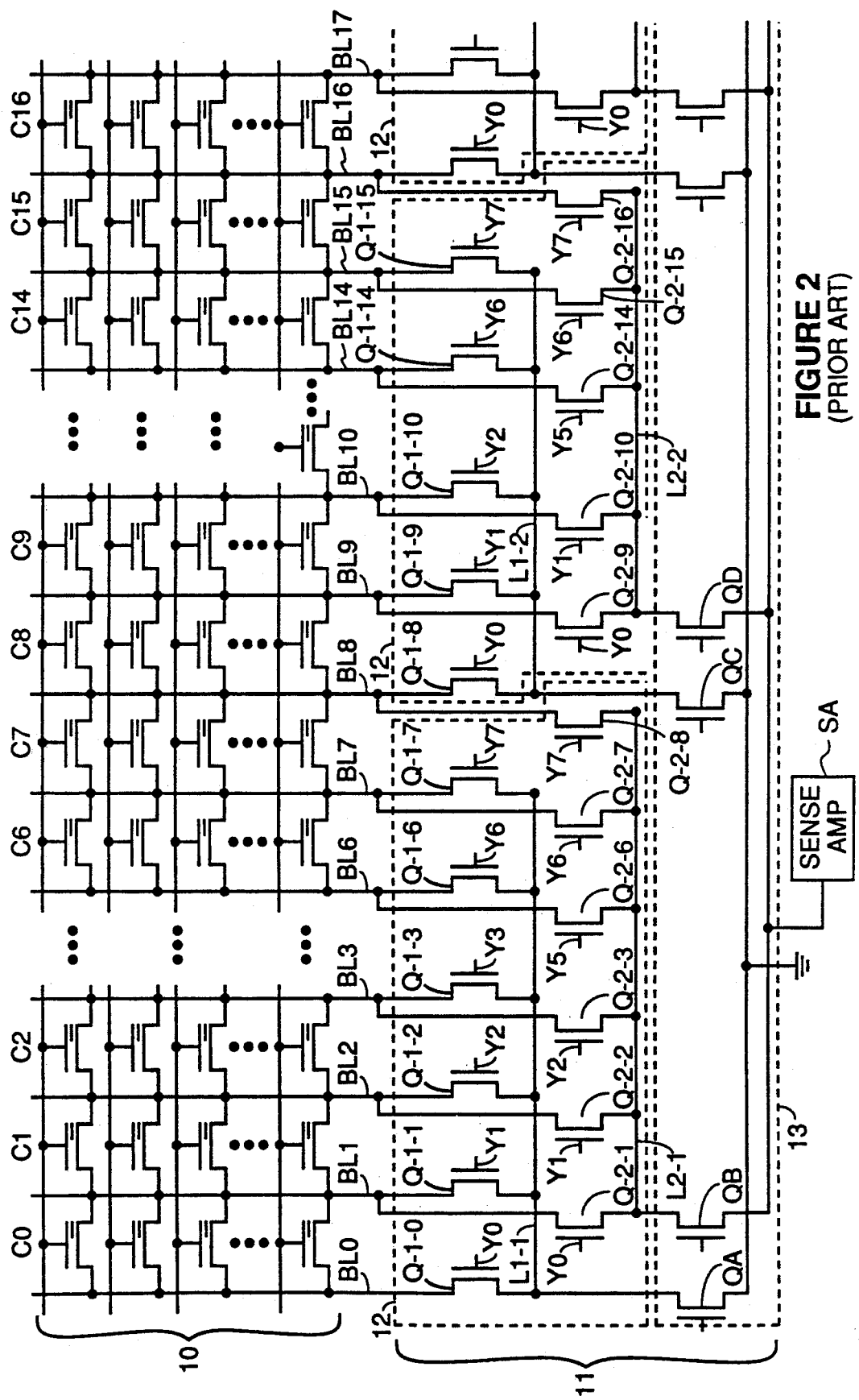
FIG. 2 schematically illustrates a decoder used in conjunction with the virtual ground floating gate transistor array of FIG. 1.
Figure 5:
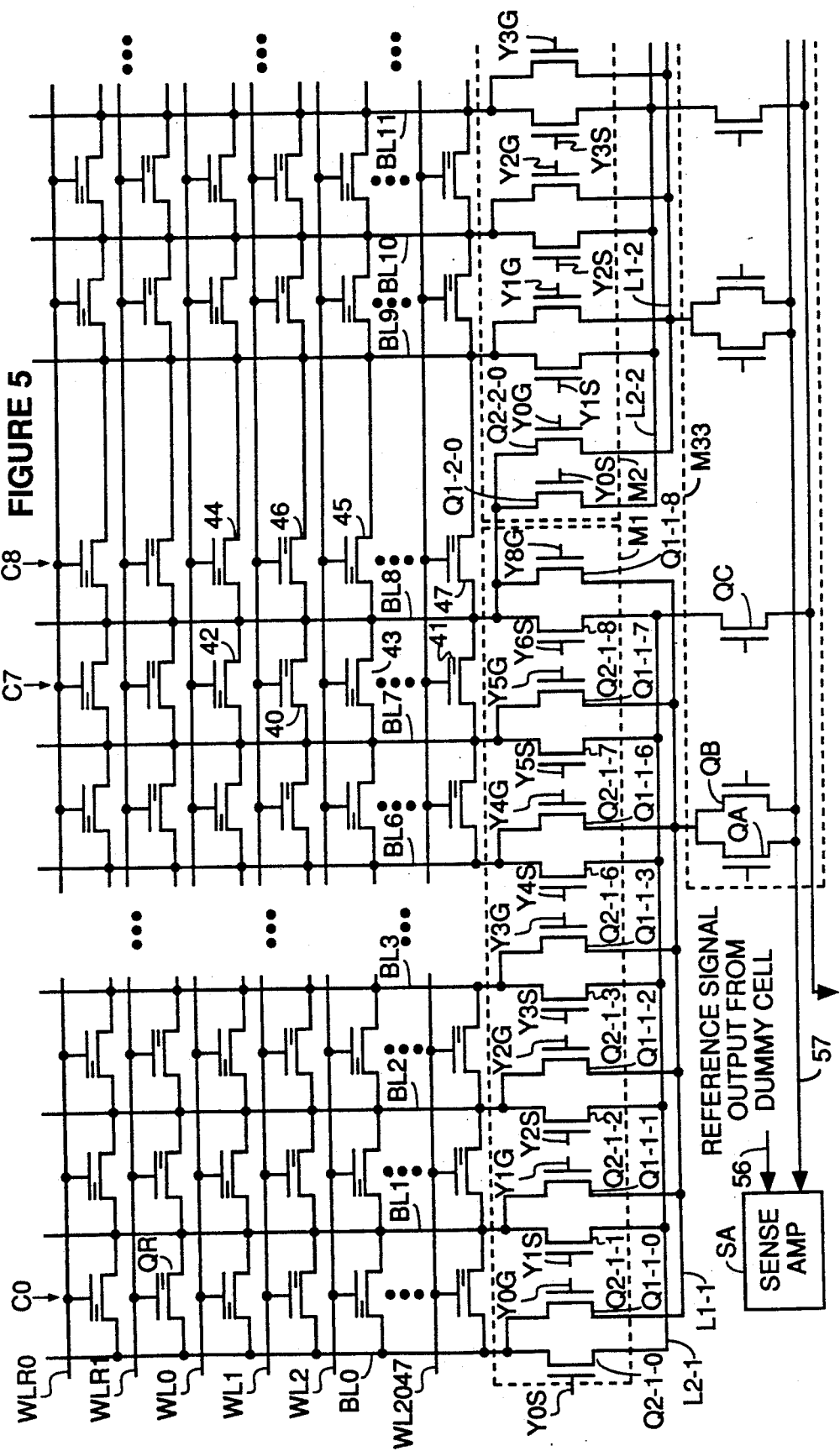
FIG. 5 schematically illustrates a portion of the Y decoder used in conjunction with the EPROM of FIG. 3 and 4.

It is noted that bit line BL8 within group G2 is coupled to an input lead of multiplexer M1 as well as an input lead to multiplexer M2. The reason for this is better understood with reference to FIG. 5 which schematically illustrates multiplexer M1, a portion of multiplexer M2, a portion of multiplexer M33, and a portion of block B1. Referring to FIG. 5 it is seen that bit line BL8 can serve as the drain for some of the transistors (e.g., transistors 40 and 41) in a column of transistors C7. Bit line BL8 can also serve as the source of a second group of transistors (e.g., transistors 42 and 43) in column C7, the drain of a third group of transistors (e.g., transistors 44 and 45) within a column of floating gate transistors C8, and the source of a fourth group of transistors (e.g., transistors 46 and 47) from column C8. When bit line BL8 is to serve as the source of a transistor within column C7, bit line BL8 is coupled via multiplexer M1 to line L2-1, which is coupled by multiplexer M33 to ground, whereas when bit line BL8 is to serve as the drain of a transistor within column C7, bit line BL8 is coupled via multiplexer M1 to line L1-1, which in turn is coupled by multiplexer M33 to sense amplifier SA. Similarly, when bit line BL8 is to serve as the source for a transistor within column C8, bit line BL8 is coupled via multiplexer M2 to line L2-2 which in turn is coupled by multiplexer M33 to ground, whereas when bit line BL8 is to serve as the drain for a transistor within column C8, bit line BL8 is coupled via multiplexer M2 to line L1-2, which in turn is coupled to sense amplifier SA via multiplexer M33. Every eighth bit line is similarly coupled to two multiplexers within the bit line decoder. It will thus be appreciated that one difference between the circuit of FIG. 5 and the circuit of FIG. 2 is that in FIG. 2 every eighth bit line is selectively coupled to ground through a first multiplexer and to sense amplifier SA through a second multiplexer, whereas in the decoder of FIG. 5, every eighth bit line can be coupled to both ground and sense amplifier SA through both a first multiplexer and a second multiplexer.

As can be seen, transistors Q1-1-0 through Q1-1-8 selectively couple one of bit lines BL0 to BL8 to line L1-1, whereas transistors Q2-1-0 to Q2-1-8 selectively couple one of bit lines BL0 to BL8 to line L2-1. Bit line BL8 can also be coupled to line L1-2 via transistor Q1-2-0, and to line L2-2 via transistor Q2-2-0.

Line L1-1 can selectively be coupled to sense amplifier SA via pass transistors QA and QB which serve as part of multiplexer M33. In addition, line L2-1 can be coupled to ground via pass transistor QC which also serves as part of multiplexer M33. Lines L1-2 to L1-32 and L2-2 to L2-32 are coupled to sense amplifier SA and ground by similar transistors within multiplexer M33.

During programming, multiplexers M1 to M33 are also used to decode the bit lines, and couple one of the bit lines to lead 57 and another of the bit lines to ground. During programming, a programming voltage VPP (typically 8 to 12 volts) is applied to lead 57 and a voltage of about 12 volts is applied to a selected word line.

Figure 6:
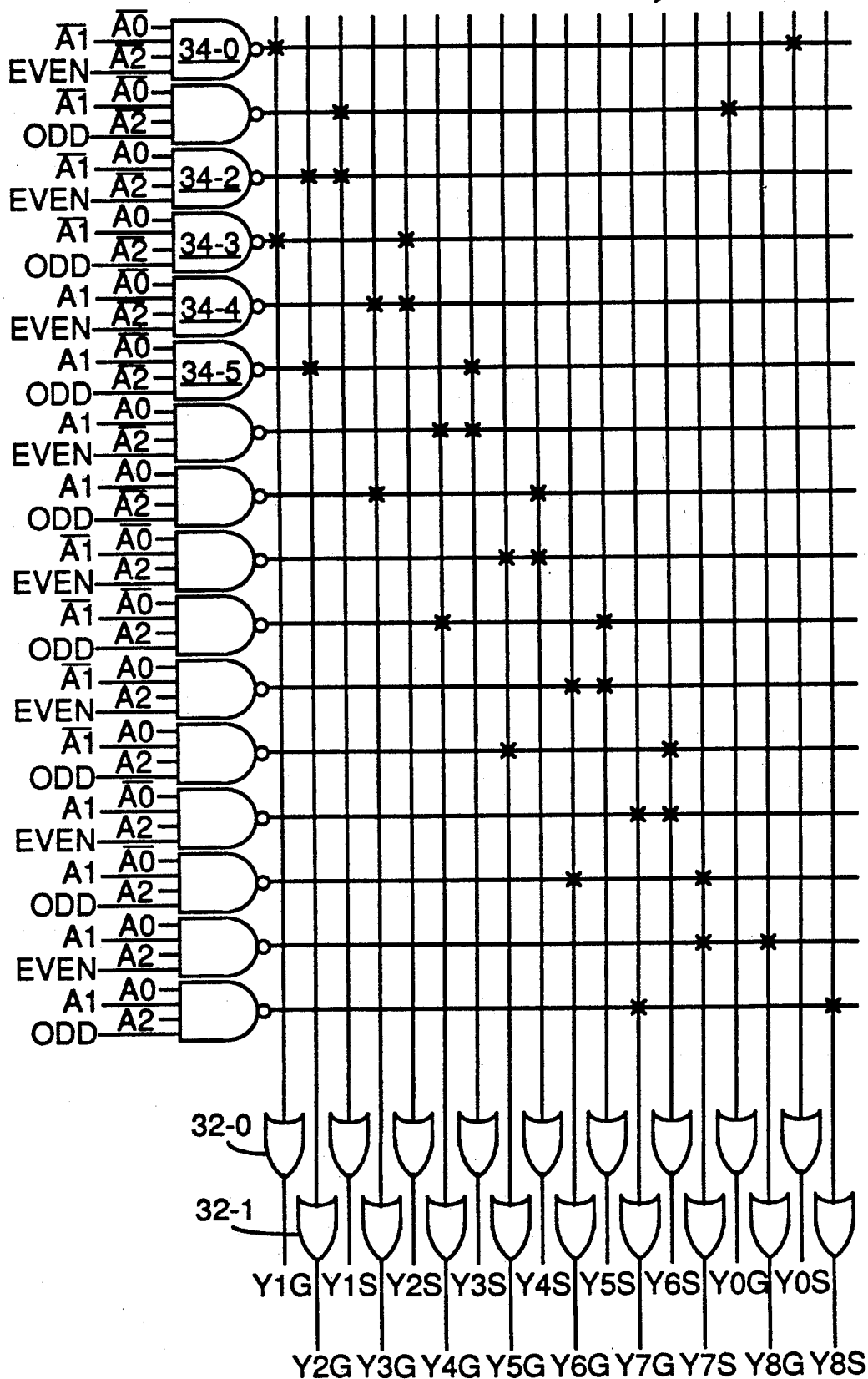
FIG. 6 schematically illustrates a logic circuit used to generate control signals used in the Y decoder of FIG. 5.

FIG. 6 illustrates a logic array 30 used to drive the gates of the transistors within multiplexers M1 to M32. As can be seen, address bits A0 through A2 are decoded to generate signals Y0S to Y8S and Y0G to Y8G, which in turn control multiplexers M1 to M32 and corresponding multiplexers coupled to EPROM blocks B1 to B8. Specifically, signals Y0S to Y8S and Y0G to Y8G are coupled to the pass transistors within multiplexers M1 to M32. (In the notation of FIG. 5, OR gate 32-0 generates the logical sum of the output signals from NAND gates 34-0 and 34-3, OR gate 32-1 generates the logical sum of the output signals from NAND gates 34-2 and 34-5, and so on.)

Address bits A4 to A8 are decoded in a conventional manner to generate control signals which control multiplexer M33 and corresponding multiplexers coupled to EPROM blocks B2 to B8.

Figure 7:
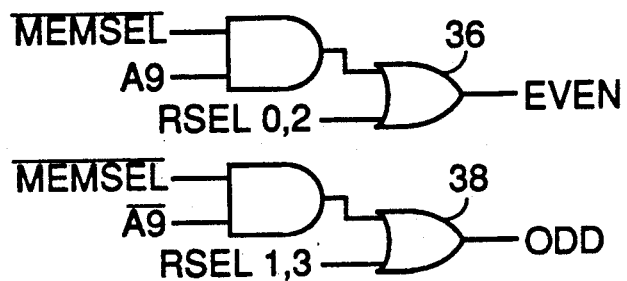
FIG. 7 illustrates a logic circuit which generates signals EVEN and ODD, which indicate whether an even-numbered or odd-numbered word line is being held active.

In accordance with one novel feature of my invention, included as input signals in FIG. 6 are signals EVEN and ODD. FIG. 7, which is described below, illustrates the logic used to generate signals EVEN and ODD. Signal EVEN is asserted when it is desired to read (or program) a transistor from an even-numbered row, i.e., a transistor whose floating gate is on the left side of the transistor (as schematically illustrated in FIG. 5), while signal ODD is asserted when it is desired to read (or program) a transistor from an odd-numbered row, i.e., a transistor whose floating gate is on the right side of the transistor. Thus, if it is desired to read a transistor in column C0, signals EVEN and ODD indicate whether an even or odd-numbered word line is held active. Thus, signals EVEN and ODD are used by the circuit of FIG. 5 to determine which of bit lines BL0, BL1 is coupled to sense amplifier SA (via line L1-1 and multiplexer M33), and which of bit lines BL0, BL1 is to be grounded. In contrast, the prior art decoder used in conjunction with array 10 does not generate signals EVEN and ODD since, for example, if a transistor in column 10 is being read, bit line BL1 must serve as the drain while bit line BL0 must serve as the source, regardless of the row number.

FIG. 7 illustrates a circuit used to generate signals EVEN and ODD. When a redundant row is not being accessed, signal $\overline{\text{MEMSEL}}$ is high, and signals RSEL 0,2 and RSEL 1,3 are held inactive. Thus, signals EVEN and ODD are controlled by row address bit A9, which determines whether an even or odd-numbered row is being accessed.

In some embodiments, the word line decoder is laid out such that two or more row address signals are required to determine whether an even or odd-numbered row is accessed. In such embodiments, the circuit of FIG. 7 must decode the two or more row address signals instead of just address signal A9.

As mentioned above, an EPROM constructed in accordance with the presently described embodiment include four redundant rows. FIG. 5 illustrates only two redundant rows, i.e. the rows connected to word lines WLR0 and WLR1, for simplicity. (It is again noted, however, that other embodiments include other numbers of redundant rows or no redundant rows at all.) Of importance, it would be desirable to construct the EPROM so that all four redundant rows could replace any nonredundant even-numbered row or any nonredundant odd-numbered row. If the row coupled to word line WL0 is being replaced by the row coupled to redundant word line WLR1, every time an address corresponding to word line WL0 is presented to the EPROM, redundant word line WLR1 is held active. However, the transistors coupled to word line WLR1 have their floating gates on the right side of the transistor, whereas the transistors coupled to word line WL0 have their floating gates on the left side of the transistor. Thus, in accordance with another novel feature of my invention, OR gate 36 asserts signal EVEN when signal RSEL 0,2 is active. (Signal RSEL 0,2 indicates that a redundant row with floating gates on the left side of the transistors is being accessed, and is asserted irrespective of whether the received address would normally access an even or odd-numbered word line.) Similarly, OR gate 38 receives signal RSEL 1,3, which indicates that a redundant row with floating gates on the right side of the transistors is being accessed, and generates signal ODD in response thereto. (Signal RSEL is asserted irrespective of whether the received address would normally access an even or odd-numbered word line.) This is in contrast to the prior art decoder used in conjunction with array 10, which does not generate signals, such as RSEL 0,2 and RSEL 1,3, because any redundant rows in array 10 have their floating gates on the right side of the cell.

Figure 8:
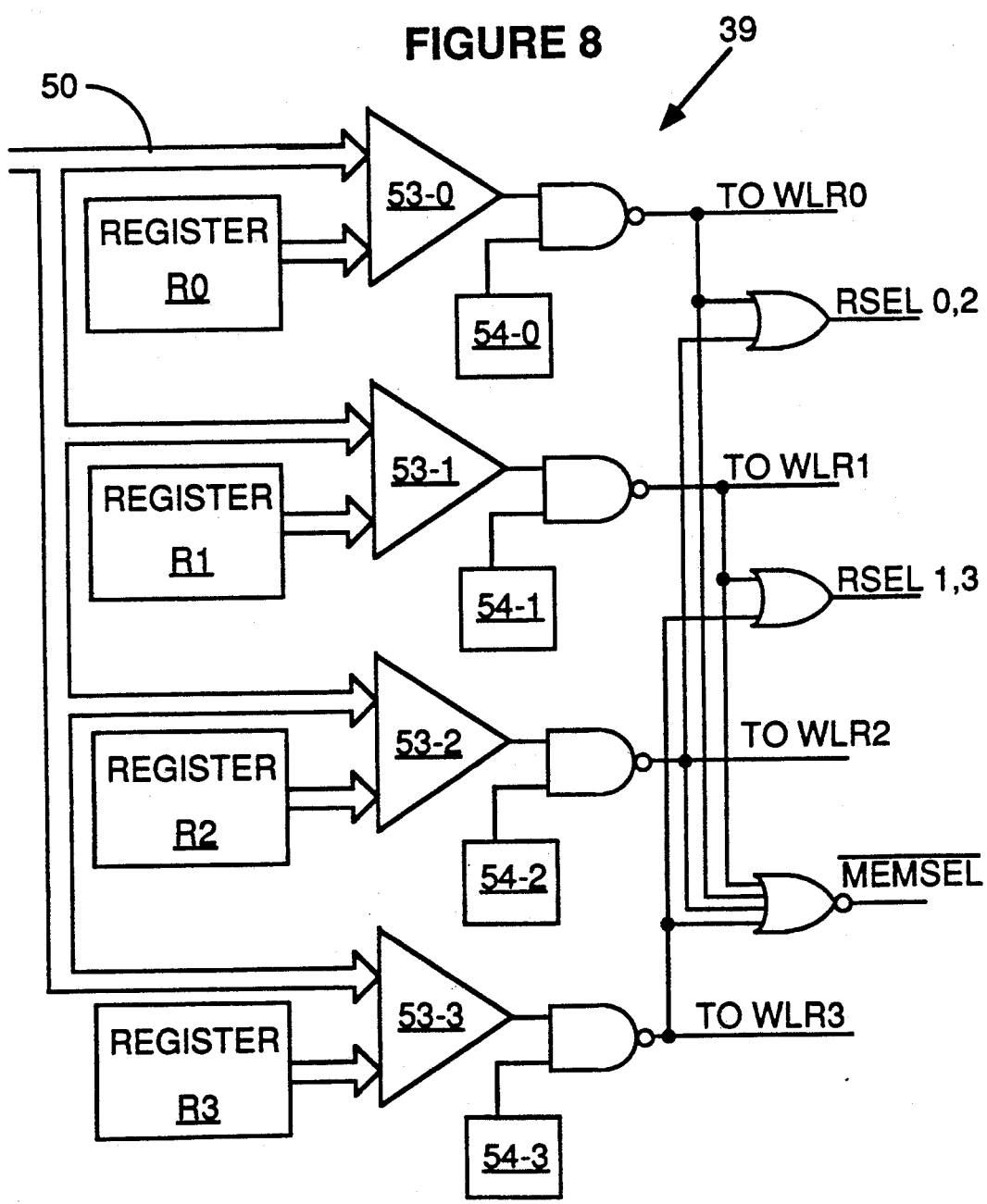
FIG. 8 illustrates circuitry used to access redundant rows of memory cells.

FIG. 8 illustrates the circuitry 39 used to generate signals RSEL 0,2, RSEL 1,3, MEMSEL, and the signals applied to word lines WLR0 to WLR3. Circuitry 39 includes nonvolatile registers R0 to R3, which are programmed during device test to store the addresses of defective rows, and associated one-bit nonvolatile registers 54-0 to 54-3, which store redundancy enable bits. Comparators 53-0 to 53-3 compare row address signals on row address lines 50 with the contents of registers R0 to R3, respectively. If the row address on lines 50 equals the contents of register R0, for example, and if a one-bit enable register 54-0 (programmed during device test) stores a one, redundant word line WLR0 is held high, signals RSEL 0,2 and EVEN are high (active), and signals ODD and $\overline{\text{MEMSEL}}$ are low. (If register 54-0 stores a zero, lines WLR0 and signal RSEL 0,2 will remain low even if the address on bus 50 equals the contents of register R0.) The signals on word lines WLR1 to WLR3 are similarly held high when the associated register 54-1 to 54-3 stores a one and the address on row address lines 50 equals the contents of associated register R1 to R3, respectively.

The reason for providing registers 54-0 and 54-3 is that if there are only three defective rows in the array, for example, and only redundant word lines WL0 to WLR2 are used, register R3 is typically left unprogrammed (and thus stores zeros). The presence of a zero in register 54-3 prevents line WLR3 from going active when a row address corresponding to word line WL0 is received. Registers 54-0 to 54-2 have a similar purpose.

Figure 4:
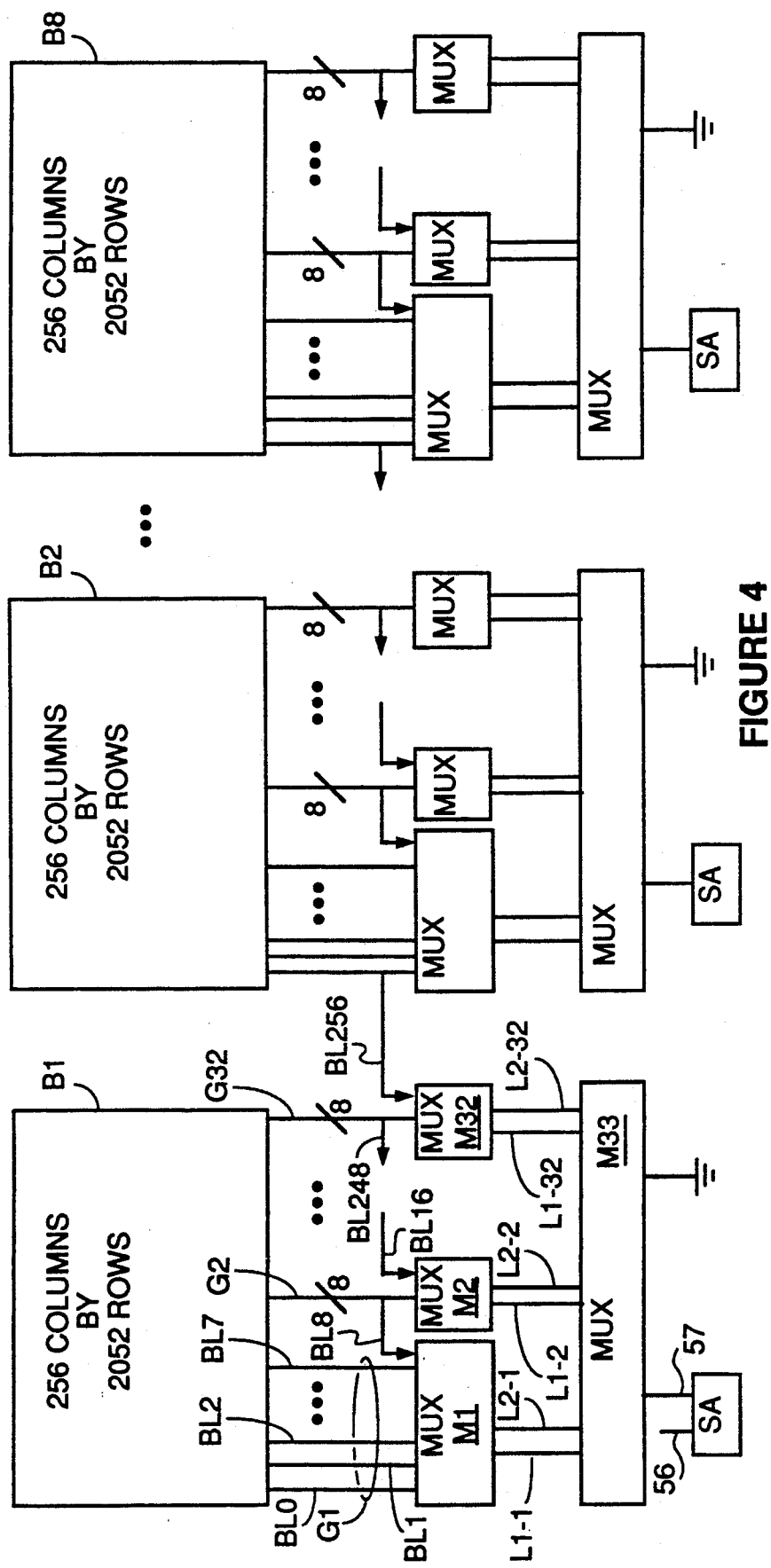
FIG. 4 schematically illustrates an EPROM array including a plurality of blocks of EPROM cells.
Figure 9:
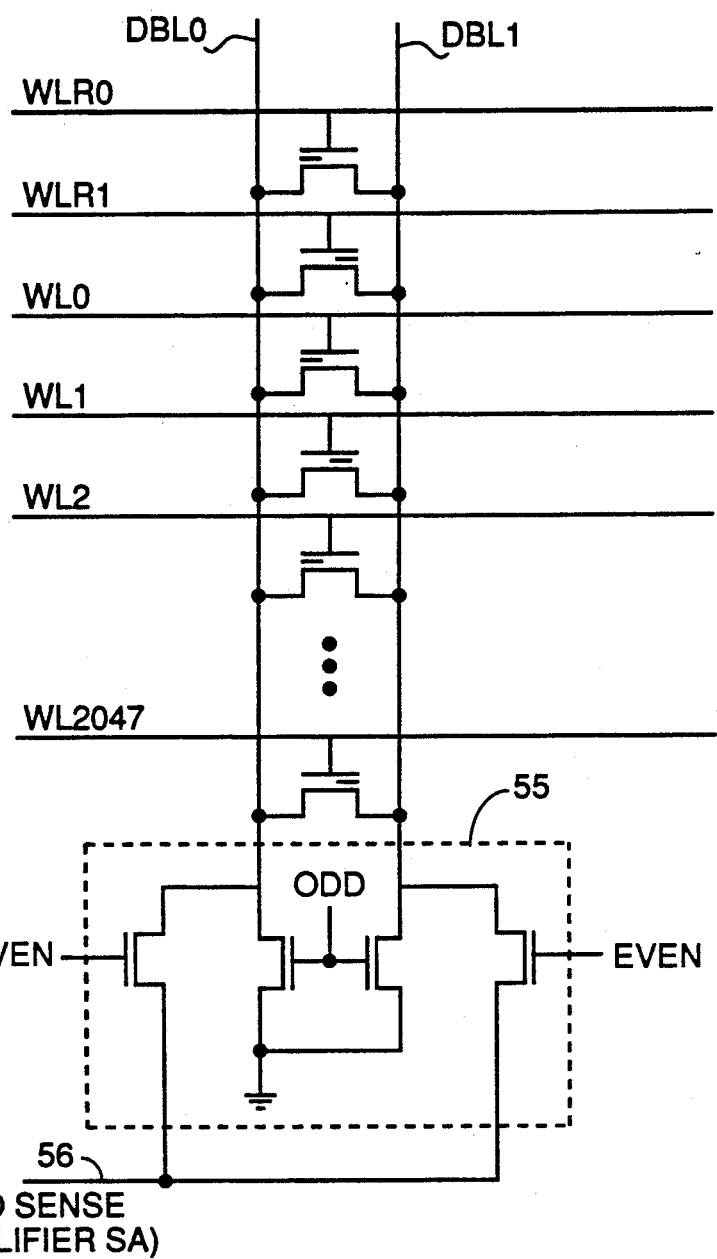
FIG. 9 illustrates a dummy column of transistors coupled to a pair of dummy bit lines.

A circuit constructed in accordance with my invention includes one or more columns of dummy transistors which are used to generate reference signals to be coupled to one or more of the sense amplifiers. In one embodiment, the EPROM includes 8 columns of dummy transistors, each constructed in the middle of an associated one of blocks B1 to B8 (FIG. 4). The columns of dummy transistors are constructed such that the floating gates within even numbered rows are on the left side of the transistor, while the floating gates within odd numbered rows are on the right of the transistors (see FIG. 9). In accordance with another novel feature of my invention, decode circuitry 55 within the EPROM couples either dummy bit line DBL0 or DBL1 to a reference input lead 56 (FIGS. 5 and 9) of sense amplifier SA, and the other of dummy bit lines DBL0, DBL1 to ground, to generate a reference voltage in response to signals EVEN and ODD. This ensures that the electrical characteristics of the dummy transistor coupled to sense amplifier SA match the electrical characteristics of the transistor being read. This is in contrast to prior art EPROMs, in which only one dummy bit line can serve as a source, and only one dummy bit line can serve as a drain.

Circuitry used to bias the dummy bit line coupled to lead 56 and the bit line coupled to lead 57 of sense amplifier SA is described in an article by S. Ali et al. entitled "A 50-NS 256K CMOS Split-Gate EPROM" published in "IEEE Journal of Solid State Circuits", February 1988, incorporated herein by reference.

In an alternate embodiment of my invention, I found that a word line decoder can be laid out more efficiently if the address lines are decoded as indicated in Table I below.

TABLE I

| A18 | A17 | A14 | A13 | Other Word Line Address Signals | Word Line Held Active |
|---|---|---|---|---|---|
| 0 | 0 | 0 | 0 | 0 | WL0 |
| 1 | 0 | 0 | 0 | 0 | WL1 |
| 0 | 1 | 0 | 0 | 0 | WL2 |
| 1 | 1 | 0 | 0 | 0 | WL3 |
| 0 | 0 | 1 | 0 | 0 | WL4 |
| 1 | 0 | 1 | 0 | 0 | WL5 |
| 0 | 1 | 1 | 0 | 0 | WL6 |
| 1 | 1 | 1 | 0 | 0 | WL7 |
| 1 | 1 | 1 | 1 | 0 | WL8 |
| 0 | 1 | 1 | 1 | 0 | WL9 |
| 1 | 0 | 1 | 1 | 0 | WL10 |
| 0 | 0 | 1 | 1 | 0 | WL11 |
| 1 | 1 | 0 | 1 | 0 | WL12 |
| 0 | 1 | 0 | 1 | 0 | WL13 |
| 1 | 0 | 0 | 1 | 0 | WL14 |
| 0 | 0 | 0 | 1 | 0 | WL15 |

The pattern in Table I is repeated for each block of 16 word lines. Thus, address signals A18, A17, A14 and A13 are all zeros if it is desired to access word line WL0+n16, where n is an integer, A18 equals 1 and A17, A14 and A13 equal zero to access WL1+n16, etc.

Figure 10:
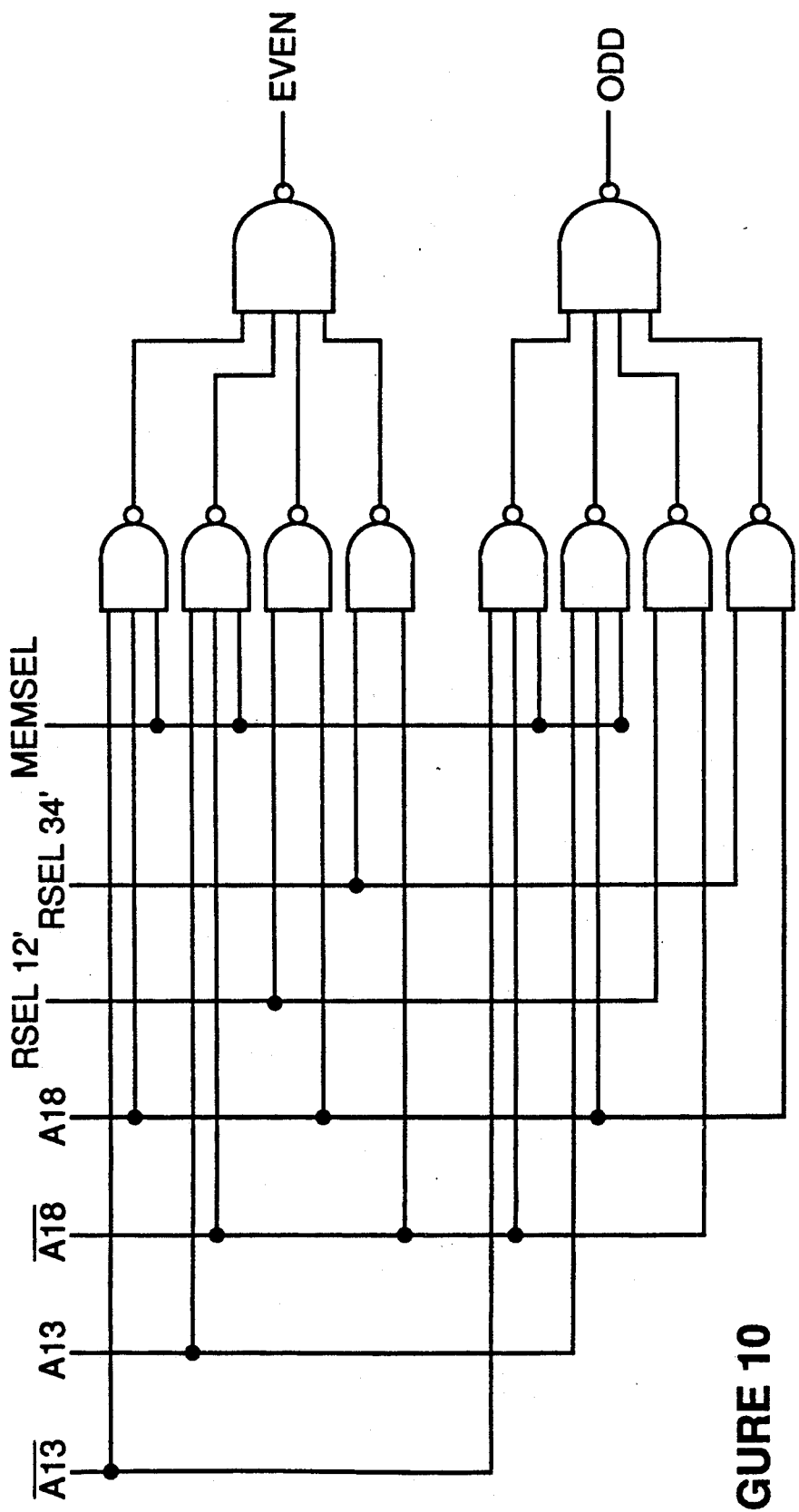
FIG. 10 illustrates logic used to generate signals EVEN and ODD in accordance with an alternative embodiment of my invention.

An even-numbered word line is accessed when both A18 and A13 equal 0, or when both A18 and A13 equal 1 (see Table I). Similarly, an odd-numbered word line is accessed when signal A18 equals 1 and A13 equals 0 or when A18 equals 0 and A13 equals 1. Thus, it is seen that it requires two address signals (address signals A18 and A13) to determine whether an even-numbered or odd-numbered word line is held active. (In this embodiment, address signals A18, A17, A14, and A13 are the least significant word line address signals.) FIG. 10 illustrates logic circuitry for generating signals EVEN and ODD for a word line decoder constructed in accordance with this alternate embodiment.

As can be seen, if signal A13 equals zero, signal EVEN equals signal $\overline{A18}$ and signal ODD equals signal A18. If signal A13 equals 1, signal EVEN equals signal A18 and signal ODD equals signal $\overline{A18}$. Signals EVEN and ODD are processed by the logic array of FIG. 6 as in the previous embodiment.

In this embodiment, the array comprises 16 redundant word lines organized into blocks of four. If word line WL0 contains a defective transistor, a block of four word lines consisting of word lines WL0, WL1, WL2 and WL3 is effectively decoupled from the array and replaced with a block of four redundant word lines. Similarly, if word line WL9 contains a defective transistor, a block of word lines consisting of word lines WL8 to WL11 is effectively decoupled from the array and replaced with a redundant block of word lines.

Figure 11:
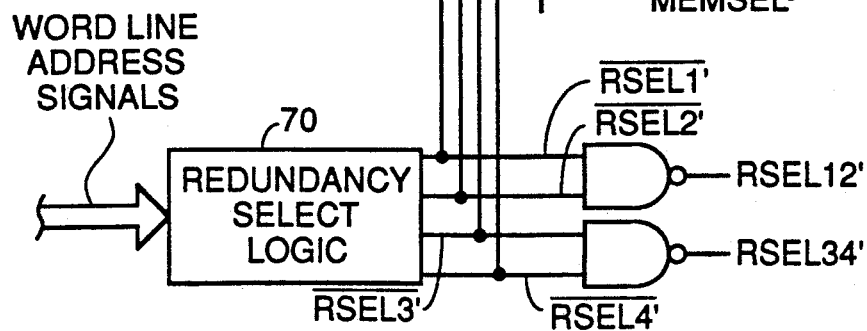
FIG. 11 illustrates logic used to select redundant rows of transistors in accordance with the alternative embodiment.

FIG. 11 illustrates logic used to generate signals $\overline{RSEL1'}$, $\overline{RSEL2'}$, $\overline{RSEL3'}$, and $\overline{RSEL4'}$, each of which cause an associated one of four blocks of four redundant word lines to be accessed. In FIG. 11, the row address bits (except for bits A17 and A18) are received by redundancy select logic 70 which determines whether a received address corresponds to a block of rows containing a defective cell. (This is done by comparing the received row address to registers within select logic 70 similar to registers R0 to R3, discussed above.) If the received address is not part of a block of locations containing a defective cell, signals MEMSEL and $\overline{RSEL1'}$ to $\overline{RSEL4'}$ are high, signals $\overline{RSEL12'}$ and $\overline{RSEL34'}$ are low and signals EVEN and ODD are governed by address signals A18 and A13.

The blocks of redundant word lines corresponding to signals $\overline{RSEL1'}$ and e,ovs/RSEL2/ ' are designed such that when signal A18 equals 0, an even-numbered redundant word line is accessed, and when signal A18 equals 1, an odd-numbered redundant word line is accessed. The blocks of redundant word lines corresponding to signals $\overline{RSEL3'}$ and $\overline{RSEL4'}$ are designed such that when signal A18 equals 0, an odd-numbered redundant word line is accessed and when signal A18 equals 1, an even-numbered word line is accessed. Irrespective of this design, the logic of FIG. 10 enables any block of redundant word lines to replace any block of non-redundant word lines while still ensuring that the correct bit lines are grounded or coupled to sense amplifier SA.

Thus, for example, if signal RSEL12' is high, i.e. a block of redundant word lines corresponding to signals $\overline{RSEL1'}$ or $\overline{RSEL2'}$ is accessed, signal EVEN equals signal A18 and signal ODD equals signal $\overline{A18}$, whereas if signal RSEL34' is high, signal EVEN equals signal $\overline{A18}$, and signal ODD equals signal A18.

While the invention has been described with respect to specific embodiments, those skilled in the art will recognize that changes can be made in form and detail without departing from the spirit and scope of the invention. For example, my invention can be used in conjunction with any floating gate memory device, e.g., EPROMs or EEPROMs or any one-transistor asymmetric device. Accordingly, all such changes come within the present invention.

I claim:

1. Structure comprising an array of asymmetrical floating gate transistors including a plurality of bit lines and a plurality of word lines, said structure further comprising:
   a sense amplifier;
   means for receiving an address;
   first decoder means for decoding a first group of address bits within said address and selecting one of said word lines in response thereto;
   second decoder means for receiving a second group of address bits of said address and for selecting in response thereto a pair of bit lines, said second decoder means receiving at least one address bit from said first group of address bits and generating a signal indicative of whether an even or odd-numbered word line is addressed by said first group of address bits, said signal being used to select a first one of said bit lines within said pair of bit lines and couple said first bit line to a reference voltage, said signal also being used to select a second one of said bit lines within said pair of bit lines and couple said second bit line to said sense amplifier;

wherein each bit line within said plurality of bit lines serves as a drain for a first group of transistors coupled to said bit line and as a source for a second group of transistors coupled to said bit line; and wherein said array is constructed such that the floating gate for each transistor within a first set of said transistors is located at a first position within said transistor, each transistor in said first set of transistors being associated with one of said even-numbered word lines, and the floating gate for each transistor within a second set of said transistors is located at a second position within said transistor, each transistor in said second set of said transistors being associated with one of said odd-numbered word lines.

2. Structure of claim 1 wherein said reference voltage is ground.

3. Structure of claim 1 wherein each word line within said plurality of word lines extends over each bit line within said plurality of bit lines.

4. Structure of claim 1 wherein said even-numbered word lines and said odd-numbered word lines extend over but are insulated from a common set of said bit lines.

5. Structure comprising:
an array of split gate floating gate transistors constructed so that the floating gates for a first group of said transistors within said array are located on a first side of said transistors within said first group and wherein the floating gates for a second group of transistors within said array are located on a second side of said transistors within said second group opposite said first side, said array including a plurality of bit lines and a plurality of word lines;
a sense amplifier;
means for receiving an address;
first decoder means for decoding a first group of address bits within said address and selecting one of said word lines in response thereto; and
second decoder means for receiving a second group of address bits of said address and at least one address bit from said first group of address bits, and for selecting in response thereto a first bit line, said first bit line being coupled to said sense amplifier, and for selecting a second bit line and coupling said second bit line to a reference voltage.

6. Structure of claim 5 further comprising a plurality of redundant rows, said structure also comprising:
means for selecting one of said redundant rows; and
means for generating a signal indicative of whether said selected redundant row comprises transistors having floating gates on said first side or on said second side, said signal being coupled to said second decoder means, said second decoder means being responsive to said signal.

7. Structure of claim 5 further comprising:
a column of dummy transistors having first and second dummy bit lines, said dummy transistors each including an associated floating gate, wherein some of said dummy transistors have their floating gate adjacent said first dummy bit line, and other dummy transistors have their floating gate adjacent said second dummy bit line; and
means for selectively connecting one of said first and second dummy bit lines to said sense amplifier and the other of said first and second dummy bit lines to said reference voltage in response to said at least one address bit from said first group.

8. Structure comprising:
an array of split gate floating gate transistors constructed so that the floating gates for a first group of said transistors within said array are located on a first side of said transistors within said first group and wherein the floating gates for a second group of transistors within said array are located on a second side of said transistors within said second group opposite said first side, said array including a plurality of bit lines and a plurality of word lines;
means for receiving an address;
first decoder means for decoding a first group of address bits within said address and selecting one of said word lines in response thereto; and
second decoder means for receiving a second group of address bits of said address and at least one address bit from said first group of address bits, and for selecting in response thereto a first bit line, said first bit line being coupled to a programming voltage, and for selecting a second bit line and coupling said second bit line to a reference voltage.

9. Structure comprising:
a floating gate transistor array including a plurality of bit lines and a plurality of word lines, wherein said bit lines are organized into m groups, each group containing n bit lines, where n and m are integers;
a sense amplifier;
means for receiving an address;
first decoder means for decoding a first group of address bits within said address and selecting one of said word lines in response thereto;
second decoder means for receiving a second group of address bits of said address and at least one address bit from said first group of address bits, and for selecting in response thereto a first bit line, said first bit line being coupled to said sense amplifier, and for selecting a second bit line and coupling said second bit line to a reference potential supply lead;
and wherein said second decoder means comprises:
m multiplexers, each multiplexer receiving an associated one of said groups of bit lines, at least m-1 of said m multiplexers receiving the nth bit line from a group of bit lines other than said associated group, so that the nth bit line of at least m-1 of said groups of bit lines is coupled to two of said m multiplexers, wherein said m multiplexers can couple any one of said received bit lines to a first associated output line, and said m multiplexers can couple any one of said received bit lines to a second associated output line;
an additional multiplexer coupled to the first and second associated output lines of said m multiplexers, said additional multiplexer coupling one of said first associated output lines to said reference potential supply lead, said additional multiplexer also coupling one of said second associated output lines to said sense amplifier;
wherein each of said bit lines can be coupled to said reference potential supply lead to serve as a source and each of said bit lines can be coupled to said sense amplifier to serve as a drain.

10. Structure of claim 9 wherein at least m-1 of said m multiplexers comprise a first group of n+1 transistors coupled between said received bit lines and said first associated output lead and a second group of n+1 transistors coupled between said received bit lines and said second associated output lead, the gates of said first and second groups of transistors being operatively coupled to said second decoder means, and wherein said nth bit line in at least m-1 of said groups of bit lines is coupled to a transistor within said first group of n+1 transistors and said second group of n+1 transistors within a first one of said m multiplexers and also within a second one of said m multiplexers.

11. Structure comprising an array of asymmetrical floating gate transistors including a plurality of bit lines and a plurality of word lines, said structure further comprising:
  means for receiving an address;
  first decoder means for decoding a first group of address bits within said address and selecting one of said word lines in response thereto; and
  second decoder means for receiving a second group of address bits of said address and for selecting in response thereto a pair of bit lines, said second decoder means receiving at least one address bit from said first group of address bits and generating a signal indicative of whether an even or odd-numbered word line is addressed by said first group of address bits, said signal being used to select a first one of said bit lines within said pair of bit lines and couple said first bit line to a reference voltage, said signal also being used to select a second one of said bit lines within said pair of bit lines and couple said second bit line to a programming voltage;
  wherein each bit line within said plurality of bit lines serves as a drain for a first group of transistors within said array and as a source for a second group of transistors within said array; and
  wherein said array is constructed such that the floating gate for each transistor within a first set of said transistors is positioned at a first location within said transistor, each transistor in said first set of transistors being associated with one of said even-numbered word lines, and the floating gate for each transistor within a second set of said transistors is positioned at a second location within said transistor, each transistor in said second set of transistors being associated with one of said odd-numbered word lines.

12. Structure of claim 3 wherein each word line within said plurality of word lines extends over each bit line within said plurality of bit lines.

13. Structure of claim 11 wherein said even-numbered word lines and said odd-numbered word lines extend over but are insulated from a common set of said bit lines.

14. Structure comprising:
  an array of asymmetrical floating gate transistors, including a plurality of bit lines and a plurality of word lines, wherein each transistor within a first group of transistors within said array has a floating gate positioned in a first location within said transistor, each transistor within said first group being associated with a word line within a first set of said word lines, each transistor within a second group of transistors within said array having a floating gate positioned in a second location within said transistor, each transistor within said second group being associated with a word line within a second set of said word lines, each of said first and second sets of word lines extending over but insulated from each bit line within said plurality of bit lines;
  a sense amplifier;
  means for receiving an address;
  first decoder means for decoding a first group of address bits within said address and selecting one of said word lines in response thereto;
  second decoder means for receiving a second group of address bits of said address and at least one address bit from said first group of address bits, and for selecting in response thereto a first bit line, said first bit line being coupled to said sense amplifier, and for selecting a second bit line and coupling said second bit line to a reference potential.

15. Structure as in claim 14, wherein each bit line within said plurality of bit lines serves as a drain for a first group of transistors within said array and as a source for a second group of transistors within said array.

16. Structure comprising:
  an array of asymmetrical floating gate transistors, including a plurality of bit lines and a plurality of word lines, wherein each transistor within a first group of transistors within said array has a floating gate positioned in a first location within said transistor, each transistor within said first group being associated with a word line within a first set of said word lines, each transistor within a second group of transistors within said array having a floating gate positioned in a second location within said transistor, each transistor within said second group being associated with a word line within a second set of said word lines, each of said first and second sets of word lines extending over but insulated from each bit line within said plurality of bit lines;
  means for receiving an address;
  first decoder means for decoding a first group of address bits within said address and selecting one of said word lines in response therefore;
  second decoder means for receiving a second group of address bits of said address and at least one address bit from said first group of address bits, and for selecting in response thereto a first bit line, a programming voltage being applied to said first bit line by said second decoder means, said second decoder means selecting a second bit line and coupling said second bit line to a reference potential.

17. Structure as in claim 16, wherein each bit line within said plurality of bit lines serves as a drain for a first group of transistors within said array and as a source for a second group of transistors within said array.

18. Structure as in claim 5, wherein each bit line within said plurality of bit lines serves as a drain for a first group of transistors within said array and as a source for a second group of transistors within said array.

19. Structure as in claim 18, wherein each bit line within said plurality of bit lines serves as a drain for a first group of transistors within said array and as a source for a second group of transistors within said array.

20. Structure comprising:
  floating gate transistor array including a plurality of bit lines and a plurality of word lines, wherein said bit lines are organized into m groups, each group containing n bit lines, where n and m are integers;
  means for receiving an address;

first decoder means for decoding a first group of address bits within said address and selecting one of said word lines in response thereto;

second decoder means for receiving a second group of address bits of said address and at least one address bit from said first group of address bits, and for selecting in response thereto a first bit line, said first bit line being coupled to a programming voltage, and for selecting a second bit line and coupling said second bit line to a reference potential supply lead;

and wherein said second decoder means comprises:

m multiplexers, each multiplexer receiving an associated one of said groups of bit lines, at least m-1 of said m multiplexers receiving the nth bit line from a group of bit lines other than said associated group, so that the nth bit line of at least m-1 of said groups of bit lines is coupled to two of said m multiplexers, wherein said m multiplexers can couple any one of said received bit lines to a first associated output line, and said m multiplexers can couple any one of said received bit lines to a second associated output line;

an additional multiplexer coupled to the first and second associated output lines of said m multiplexers, said additional multiplexer coupling one of said first associated output lines to a reference potential supply lead, said additional multiplexer also coupling one of said second associated output lines to said programming voltage;

wherein each of said bit lines can be coupled to said reference potential supply lead to serve as a source and each of said bit lines can be coupled to said programming voltage to serve as a drain.

* * * * *